United States Patent [19]

Atwood et al.

[11] Patent Number: 5,157,342
[45] Date of Patent: Oct. 20, 1992

[54] PRECISION DIGITAL PHASE LOCK LOOP CIRCUIT

[75] Inventors: Kenneth L. Atwood; Peter K. Pae, both of Ridgecrest, Calif.

[73] Assignee: The United States of America as represented by the Secretary of the Navy, Washington, D.C.

[21] Appl. No.: 752,294

[22] Filed: Aug. 30, 1991

[51] Int. Cl.[5] .......................... H03K 5/13; H03K 5/22
[52] U.S. Cl. ................................... 328/155; 307/262; 307/603; 328/55; 331/1 A
[58] Field of Search ..................... 307/262, 601–605; 328/155, 99; 331/1 A, 17, 25

[56] References Cited

U.S. PATENT DOCUMENTS

| | | | |
|---|---|---|---|
| 4,182,994 | 1/1980 | Aschwanden | 331/1 A |
| 4,795,985 | 6/1989 | Gailbreath, Jr. | 328/155 |
| 4,820,993 | 4/1989 | Cohen et al. | 328/155 |
| 4,845,685 | 7/1989 | Wechsler et al. | 367/97 |
| 4,847,870 | 7/1989 | Butcher | 375/87 |

OTHER PUBLICATIONS

William C. Lindsey, A Survey of Digital Phase-Locked Loops, "Proceedings of the IEEE", vol. 69, No. 4, Apr., 1981, pp. 410–431.

Primary Examiner—Timothy P. Callahan
Attorney, Agent, or Firm—Harvey A. Gilbert; Melvin J. Sliwka; John L. Forrest, Jr.

[57] ABSTRACT

A digital PLL circuit has a serial shift register receiving input pulses and producing time-delayed output pulses, a clock generator applying clock pulses to the shift register to drive it and set the phase shift of the output pulses, and a digitally-controlled potentiometer connected in series with the clock generator and being adjustable to change its resistance in increments in order to adjust the resistance of the clock generator and thereby set the frequency of the clock pulses applied to the shift register and the time delay produced by the shift register. A feedback control arrangement receives the same digital input pulses as received by the shift register and detects the periods of the input pulses by counting to produce control pulses proportional to the detected periods. A ROM unit stores a look-up table of values representing an array of different counts of increments by which the potentiometer resistance can be adjusted. The ROM unit can be accessed by input signals identifying different addresses thereof. The input signals are composed of the control pulses and other external pulses defining different desired phase shifts of the output pulses. The ROM unit produces output signals that are used to adjust the resistance of the potentiometer by the counts of increments stored at the accessed addresses and thereby set the desired frequency of the clock pulses and the phase shift of the output pulses.

20 Claims, 4 Drawing Sheets

PRECISION DIGITAL PHASE LOCK LOOP CIRCUIT

BACKGROUND OF THE INVENTION

1. Field of the Invention

The present invention generally relates to phase lock loop circuits and, more particularly, to a digital phase lock loop circuit which exhibits high precision over a wide variation of frequencies and duty cycles.

2. Description of the Prior Art

Analog phase lock loop (PLL) circuits have been used for many years in a wide variety of applications. However, analog PLL circuits suffer from sensitivity to DC drifts and component saturations and need for calibration and periodic adjustments.

Digital PLL circuits do not suffer from these problems. The implementation of the PLL in the digital domain is reported by William C. Lindsey and Chak Ming Chie in "A Survey of Digital Phase-Locked Loops", *Proc. IEEE*, vol. 69, pp. 410–431, April 1981. Representative examples of digital PLL circuits in the prior percent art are disclosed in U.S. Pat. No. 4,795,985 to Gailbreath, Jr., U.S. Pat. No. 4,820,993 to Cohen et al., U.S. Pat. No. 4,845,685 to Wechsler et al., and U.S. Pat. No. 4,847,870 to Butcher.

Certain military applications, such as equipment for testing circuits in missiles under development by the Department of the Navy, require precision PLL circuits. In the past, a voltage-controlled resistor would have been used for this application. However, this device is analog and would not achieve the precision needed in PLL circuits for these applications. Also, use of a voltage-controlled resistor would not be practical due to the considerable amount of circuitry required to implement its use. Thus, a need exists for a digital PLL circuit capable of providing more precision.

SUMMARY OF THE INVENTION

The present invention provides a precision digital PLL circuit designed to satisfy the aforementioned need. The digitally-controlled PLL circuit of the present invention uses a serial shift register with a variable clock frequency to control a time delay which results in a desired phase shift. The variable clock frequency is controlled by a digitally-controlled potentiometer. The precision digital PLL circuit of the present invention can be implemented as a hybrid microcircuit which would be useful in all areas in which digital PLL circuits are used.

Accordingly, the present invention is directed to a precision digital phase lock loop circuit which comprises: (a) a serial shift register for receiving digital input pulses and producing time-delayed digital output pulses from the input pulses; (b) a clock generator for applying clock pulses to the shift register to drive it and set the time delay and thereby the phase shift of the output pulses; (c) a digitally-controlled potentiometer unit connected in series with the clock generator and being adjustable to change its resistance in increments in order to adjust the resistance of the clock generator and thereby set the frequency of the clock pulses applied to the shift register and the time delay produced by the shift register; and (d) a feedback control arrangement for receiving the same input pulses as received by the shift register and detecting the periods of these input pulses, the feedback control arrangement also for receiving other pulses from an external source representing desired phase shifts of the output signals of the shift register and, in response to receiving the input pulses and the other pulses, adjusting in increments the resistance of the potentiometer unit and thereby setting the desired frequency of the clock pulses generated by the clock generator and the phase shifts of the output pulses produced by the shift register.

The feedback control arrangement includes a control unit, a potentiometer adjustment unit, and a read-only memory (ROM) unit serially connected between the control unit and the ROM unit. The control unit receives the same digital input pulses as received by the shift register and detects the periods of the input pulses, by counting, to produce control pulses proportional to the detected period. The ROM unit stores a look-up table of values representing an array of different counts of increments by which the resistance of the potentiometer unit can be adjusted. The ROM unit is connected to the control unit and can be accessed by input signals which identify different addresses of the memory unit. The input signals are composed of the control pulses from the control unit and pulses from an external source defining different desired phase shifts of the output pulses.

The ROM unit produces output signals which are received by the potentiometer adjustment unit and used to adjust the resistance of the potentiometer unit by the counts of increments stored at the accessed addresses of ROM unit. The potentiometer unit thereby sets the desired frequency of the clock pulses and the phase shifts of the output pulses in response to combining of the desired phase shifts with the periods of input pulses received by the shift register.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which.

DETAILED DESCRIPTION OF THE INVENTION

Figure 1:
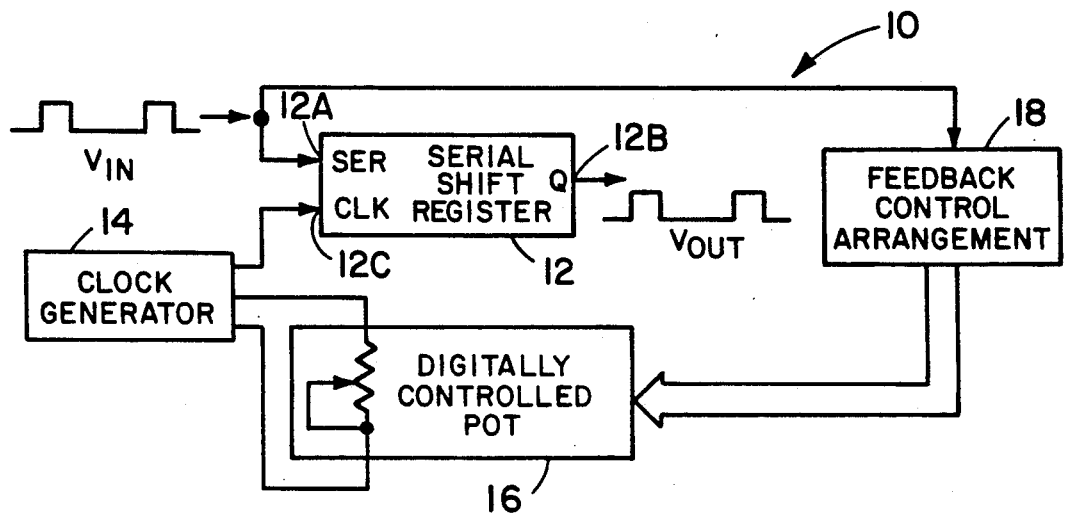
FIG. 1 is a general block diagram of a precision digital PLL circuit of the present invention.
Figure 2:
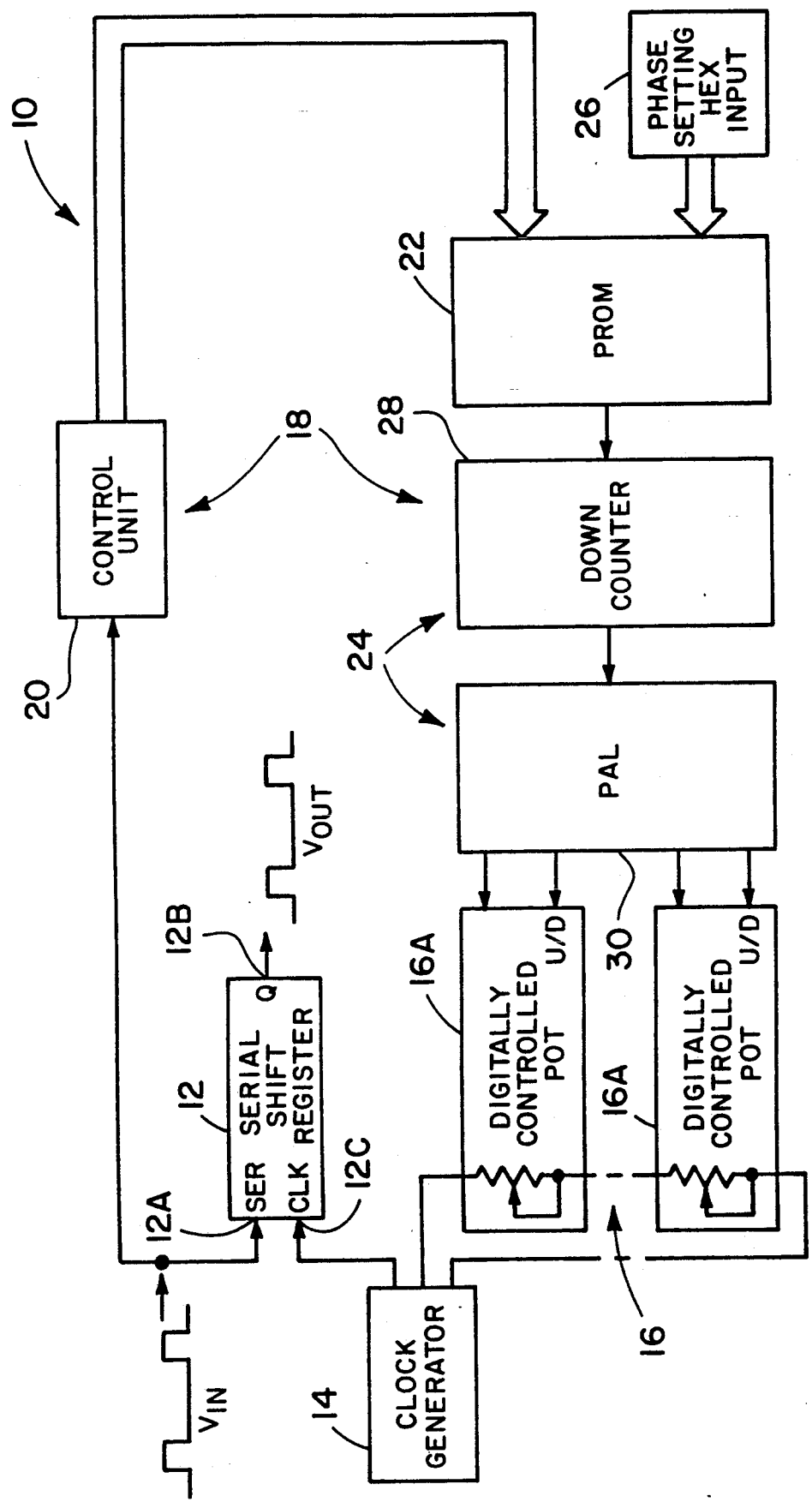
FIG. 2 is a detailed block diagram of the precision digital PLL circuit of the present invention.

Referring now to the drawings, and particularly to FIGS. 1 and 2, there is shown, in block diagram form, a precision digital phase lock loop (PLL) circuit of the present invention, being generally designated by the numeral 10. The digital PLL circuit 10 basically includes a serial shift register 12, a clock pulse generator 14, a digitally-controlled potentiometer unit 16, and a feedback control arrangement 18.

More particularly, the serial shift register 12 of the digital PLL circuit 10 has a serial (SER) input 12A for receiving a succession of digital incoming, or input, pulses $V_{in}$ and an output (Q) 12B for producing a succession of time-delayed digital outgoing, or output, pulses $V_{out}$ from the input pulses. The shift register 12 also has a clock (CLK) input 12C. The clock pulse generator 14 of the digital PLL circuit 10 generates and applies a succession of clock pulses to the shift register 12. The clock pulses drive the shift register 12, causing it to serially transfer pulses from its input 12A to output 12B with a time delay, or, in other words, to produce time-delayed outgoing pulses embodying a desired phase shift at its output 12B, from incoming pulses received at its input 12A. The frequency of the clock pulses produced by the clock pulse generator 14 sets the time delay of the shift register 12 in transferring the pulses from its input 12A to output 12B.

The potentiometer unit 16 of the digital PLL circuit 10 includes a plurality of digitally-controlled potentiometer modules 16A connected in series with one another and with the clock pulse generator 14. The clock generator 14 is adjustable in resistance in order to change the frequency of the clock pulses generated by the clock generator 14. The resistance of the potentiometer unit 16 can be varied in precise increments in order to thereby adjust the resistance of the clock generator 14 and thereby set the frequency of the clock pulses applied to the shift register 12 and the time delay produced by the shift register.

The feedback control arrangement 18 of the digital PLL circuit 10 receives the same digital input pulses as received by the shift register 12 and is capable of detecting the periods of these input pulses. The feedback control arrangement 18 also receives signals representing the desired phase shifts of the output signals of the shift register 12. In response to receiving the input pulses and detecting the periods of input pulses and in response to receiving the desired phase shift signals, the control arrangement 18 adjusts the resistance of the potentiometer unit 16 by precise increments. Such adjustment, in turn, sets the desired frequency of the clock pulses generated by the clock generator 14 and sets the time delay of the shift register 12 which produces output pulses having the desired phase shift at the output 12B of the shift register 12.

More particularly, the feedback control arrangement 18 includes a control unit 20, a programmable read-only memory (ROM) unit 22, and a potentiometer adjusting unit 24. The control unit 20 receives the same digital input pulses as received by the shift register 12 at its input 12A. The control unit 20 detects the period of the input pulses, by counting, and produces control pulses representing a count proportional to the detected period.

The ROM unit 22 stores a look-up table of values representing an array of different counts of increments by which the resistance of the potentiometer unit 16 can be adjusted. The ROM unit 16, being connected to the control unit 20, can be accessed by input signals which identify different addresses of the memory unit 22. The input signals are composed of the control pulses from the control unit 20 and other pulses from an external source 26 defining different desired phase shifts of the output pulses. The ROM unit 22 produces output signals which are received by the potentiometer adjustment unit 24.

The potentiometer adjustment unit 24 includes a Down counter 28 and a programmable array logic (PAL) 30. The Down counter 28 receives the output signals of the ROM unit 22 and provides the correct count stored at the accessed address of ROM unit 22 to use in adjusting the resistance of the potentiometer unit 16. The PAL 30 is an elaborate array of combinational logic which is programmed to provided a desired set of logic functions. As such, the PAL 30 is used to adjust the resistance of the potentiometer unit 16 by applying the correct count of the increments to the potentiometer unit 16. In particular, the PAL 30 functions to adjust the UP and DOWN control inputs and the increment (INC) inputs of the potentiometer modules 16A. The PAL 30 is programmed to count all the way up to the maximum count very fast before counting down to the correct count, as provided by the Down counter 28, so that the potentiometer modules 16A will have the maximum resistance value before going down to a correct resistance value to adjust the frequency of the clock pulses to the serial shift register 12.

The adjusted potentiometer unit 16 thereby sets the desired frequency of the clock pulses generated by the clock generator 14 and the phase shifts of the output pulses produced by the shift register 12. To summarize, due to the presence of the feedback control arrangement 18, the phase shifts of the output pulses are set as desired in response to the combination of the control pulses representing the detected periods of the input pulses received by the shift register 12 and the other pulses representing desired phase shifts received from the external source 24.

Figure 3:
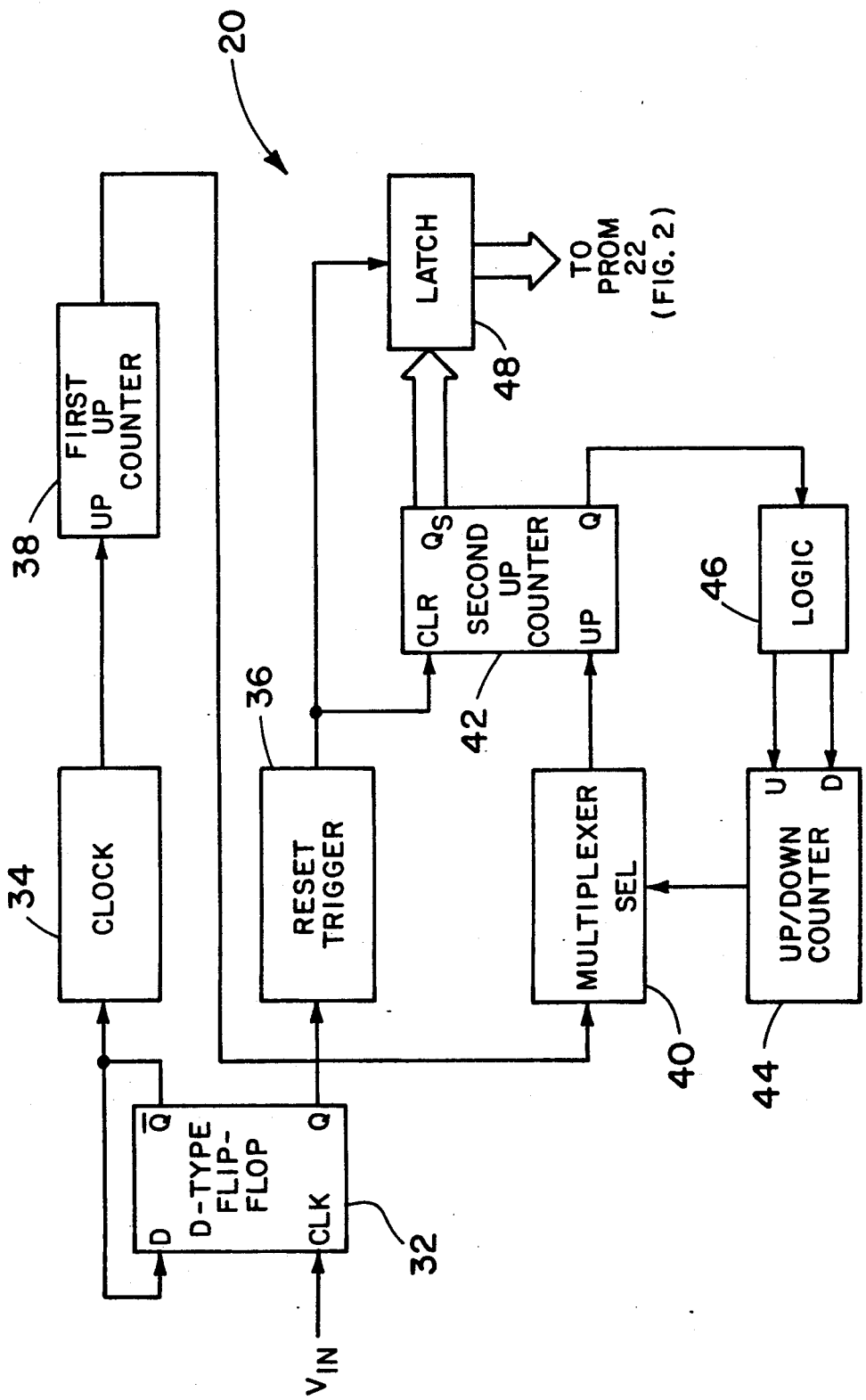
FIG. 3 is a detailed block diagram of the control unit of the circuit of FIG. 2.

FIG. 3 illustrates a detailed block diagram of the control unit 20 of the feedback control arrangement 18 of the circuit 10 of FIG. 2. Basically, the control unit 20 includes a D-type flip-flop 32, a clock 34, a reset trigger 36, a first Up counter 38, a multiplexer 40, a second Up counter 42, and an Up/Down counter 44. The clock 34 is connected between a not-Q output of the flip-flop 32 and an UP input of the first Up counter 38. The multiplexer 40 is connected between Q outputs of the first Up counter 38 and an UP input of the second Up counter 42. The reset trigger 36 is connected between a Q output of the flip-flop 32 and a clear CLR input of the second UP counter 42. The Up/Down counter 44 is connected to select SEL inputs of the multiplexer 40. Logic 46 is connected between a Q output of the second Up counter 42 and the Up and Down inputs of the Up/Down counter 44. The remaining Q outputs of the second Up counter 42, which provide the control pulses described earlier, are connected to the inputs of the programmable ROM unit 22 via respective inputs and outputs of a latch 48. An enable EN input of the latch 48 is connected to the output of the reset trigger 36.

Figure 4:
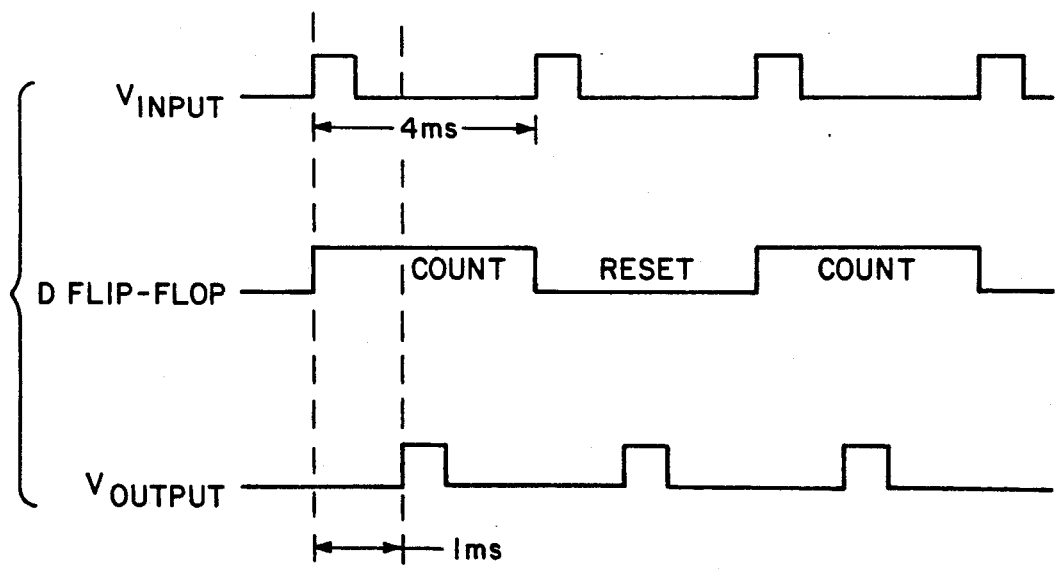
FIG. 4 is a waveform timing diagram of some signals employed by the PLL circuit.

The CLK input of the flip-flop 32 receives the same input signal $V_{in}$ as received by the SER input 12A of the shift register 12. As shown in the diagram of FIG. 4, occurrence of the first rising edge of the input signal $V_{in}$ followed by the next or second rising edge of the input signal $V_{in}$ represents one period of the input signal and causes the flip-flop 32 to toggle from low to high state and then toggle from high back to low state. During this complete transition the clock 34 applies clock pulses to the Up input of the first Up counter 38. Thus, the first Up counter 38 starts counting on the first rising edge of the input signal and stops counting on the next or second rising edge of the input signal. At the same instances, the reset trigger 36 operates to clear the counts of the second Up counter 42.

The clock 34 has a higher output speed than the clock generator 14 applying clock pulses to the shift register 12. The first Up counter 38 functions to divide the frequency of the clock pulses received from the clock 34. The frequency-divided clock pulses from the first Up counter 38 are inputted to the multiplexer 40 which is used to output only the clock pulses with a desired frequency to the second Up counter 42. One of the Q outputs of the second Up counter 42 is used to control Up and Down control inputs of the Up/Down counter 44 via the gates of logic 46. The Q outputs of the Up/Down counter 44 are, in turn, used to control the select SEL inputs of the multiplexer 40. If the second Up counter 42 has too many counts, then the one Q output of the second counter 42 makes the Up/Down counter 44 count up so that a lower frequency clock or fewer counts can be passed through the multiplexer 40, and vice versa. Therefore, the number of counts is automatically adjusted to avoid too many counts for a low frequency input signal and too few counts for a high frequency input signal so that accuracy of the circuit 10 can be maintained constant, independent of the input signal frequency.

The digital PLL circuit 10 of the present invention thus provides a more precise digital phase locking circuit over a wide variation of frequencies and duty cycles. The circuit uses a shift register with a variable clock frequency to control a time delay which results in a phase shift. The variable clock frequency is controlled by a digitally-controlled potentiometer. The circuit can accommodate incoming digital pulses, such as square waves, varying in duty cycle and in pulse width. The duty cycle, or time between pulses, might vary from 300 milliseconds to 1 microsecond. The circuit will maintain a constant phase shift from any phase setting ranging from 0° to 359°. The circuit 10 will adjust automatically to changes in frequency and still maintain a constant phase shift over a range of 250 Hz to 5.0 kHz. The circuit operates on a pulse-by-pulse basis and takes two pulse cycles to complete an adjustment of the phase shift of the output pulse.

The operation of the precision digital PLL circuit 10 will now be described using the following example. Suppose that a 90° phase shift of a 250 Hz input signal is desired. The desired phase shift of 90° will be provided as an input to the address of the ROM unit 22. The desired phase shift is fed to the ROM unit 22 as a three-digit hexadecimal code or number. If hexadecimal number 000 represents a 0° phase shift and hexadecimal number 167 represents a 359° phase shift, then hexadecimal number 5A represents a 90° phase shift.

As seen in the waveform timing diagram of FIG. 4, the 250 Hz input signal composed of digital pulses has a period of 4 milliseconds. The time delay wanted in the shift register 12 for a 90° phase shift of a 250 Hz input signal is found by the following equation.

$$(90/360) \times (4\ ms) = 1 ms.$$

The shift register 12 will thus be required to delay the input signal by 1 millisecond. The delay is accomplished by adjusting the frequency of the clock pulses applied to the shift register 12 by the clock pulse generator 14. The initial frequency of the clock pulses applied to the shift register 12 does not matter because the frequency will be adjusted automatically to the correct frequency within two periods of the input signal by the feedback control arrangement 18 as described above which sets the potentiometer unit 16 to the correct resistance. The frequency of the clock pulses applied to the shift register 12 is controlled by a resistance and capacitance of the clock pulse generator 14. The resistance of the generator 14 is changed by adjusting the resistance of the potentiometer unit 16 to give the clock frequency wanted.

The D flip-flop 32 of the control unit 20 is used to find the period of the incoming signal from rising edge to rising edge, as seen in FIG. 4. The feedback control arrangement 18 functions by starting the first Up counter 36 on the rising edge of the first input pulse and stopping the counter 36 on the rising edge of the second pulse. The frequency of the clock pulses supplied by the clock 34 to the first Up counter 36 is much faster than the frequency of the clock pulses applied to the shift register 12 by the clock pulse generator 14. By starting and stopping the first Up counter 36 on the rising edges of the input signal, a count, which is proportional to the period of the incoming signal, is generated at the end of the input period. The count and the hexadecimal phase value or code that is fed into the circuit 10 are used to address the look-up table in the programmable ROM unit 22. The output of the ROM unit 22 contains a correct count to increment the digitally-controlled potentiometer unit 16 to the correct resistance.

The look-up table of values representing different counts by which to increment and adjust the resistance of the potentiometer unit 16 is arrived at as follows. For a range of from 250 Hz to 5.0 kHz the clock frequency range of the shift register 12 for a 90° phase shift is from 16 kHz to 320 kHz. A resistance range of from 379.2 kOhms to 19.0 kOhms is required. The equation for the shift register clock frequency is as follows:

$$F_c = 1/(P) \times (1/360)(Y)(1/16)$$
$$= 5760(F)/Y$$

where P is the period of the input signal and F is the frequency of the input signal. Y is the phase shift wanted. The resistance value of the potentiometer unit 15 that is required is as follows:

$$R_d = R - 4.4\ kOhms\ where$$

$$R = 0.455/[(F_c)(C)] = 0.455(Y)/5760(F)(C)$$

where C is the capacitance required which is equal to $75 \times 10^{-12}$ Farads and 4.4 kOhms is a non-variable, or fixed, resistance in series with the potentiometer unit 16 and the clock pulse generator 14.

The number of steps or increment counts stored in the look-up table that is required for adjusting the potentiometer unit 16 is arrived at as follows:

$$n = R_d/1010$$
$$= \{[0.455(Y)/5760(F)(C)] - 4400\}/1010.$$

Thus, a frequency of 250 Hz and a desired phase shift of 90° would give a hexadecimal address of 2D7D to the ROM unit 22 and a hexadecimal output of 0173 from the look-up table of the ROM unit.

Figure 5:
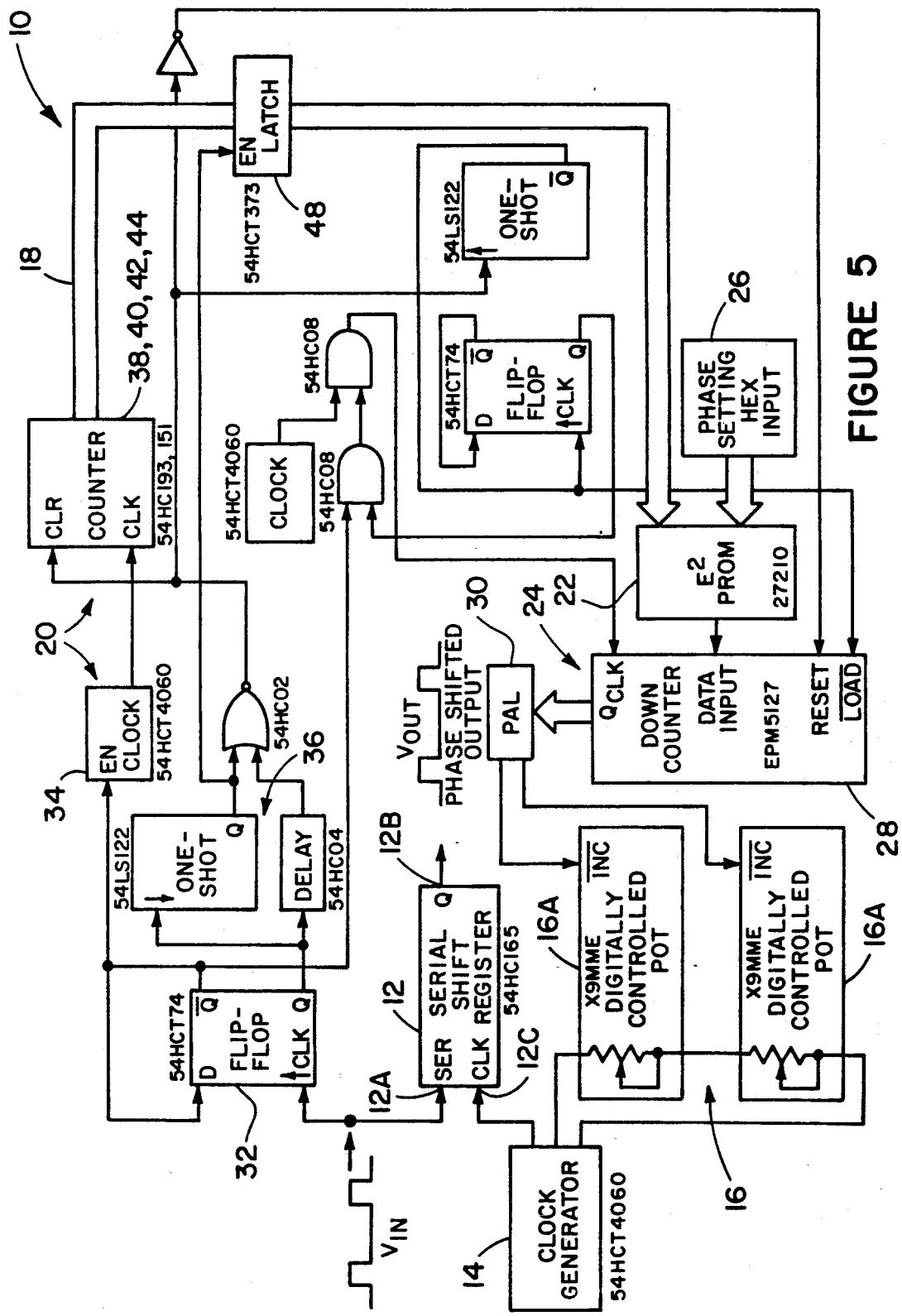
FIG. 5 is a more detailed block diagram of an exemplary embodiment of the precision digital PLL circuit of the present invention.

FIG. 5 illustrates a more detailed block diagram of an exemplary embodiment of the precision PLL circuit 10 of the present invention which has been described above. The type numbers of commercially-available components which can be employed in the circuit 10 are set forth in the various blocks of the diagram.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the forms hereinbefore described being merely exemplary embodiments thereof.

Having thus described the invention, what is claimed is:

1. A precision digital phase lock loop circuit, comprising:

a serial shift register for receiving digital input pulses and producing time-delayed digital output pulses from the input pulses;

a clock generator for applying clock pulses to said shift register to drive it and set the time delay and thereby the phase shift of the output pulses, said generator having a resistance;

a digitally-controlled potentiometer unit connected in series with said clock generator and being adjustable to change the resistance of said potentiometer unit in increments in order to adjust the resistance of said clock generator and thereby set the frequency of the clock pulses applied to said shift register and the time delay produced by said shift register; and a feedback control arrangement for receiving the same input pulses as received by said shift register and detecting the periods of these input pulses, said feedback control arrangement also for receiving other pulses from an external source representing desired phase shifts of the output signals of said shift register and, in response to receiving the input pulses and the other pulses, adjusting in increments the resistance of said potentiometer unit and thereby setting the desired frequency of the clock pulses generated by said clock generator and the phase shifts of the output pulses produced by said shift register.

2. The circuit of claim 1 wherein said feedback control arrangement includes a control unit, a memory unit, and a potentiometer adjustment unit, said memory unit being interposed in series between said control and potentiometer adjustment units.

3. The circuit of claim 2 wherein said potentiometer unit includes a plurality of potentiometer modules connected in series with one another and with said clock generator, said potentiometer modules also being connected in parallel with said potentiometer adjustment 4. The circuit of claim 2 wherein said memory unit is a programmable read-only memory.

5. The circuit of claim 2 wherein said control unit receives the same digital input pulses as received by said shift register and detects the periods of these input pulses by counting and produces control pulses proportional to the detected periods.

6. The circuit of claim 5 wherein said control unit includes:

a flip-flop, a clock, and a first counter, said clock being connected between said flip-flop and said first counter;

said flip-flop being operable for sensing the beginning and end of one period between consecutive input pulses and causing said clock to start and stop application of clock pulses to said first counter in correspondence to the beginning and end of the one period;

said first counter, in response to application of the clock pulses, being operable to start counting and outputting clock pulses in correspondence to the beginning and end of the one period, the number of clock pulses outputted by said first counter being a multiple of the number of clock pulses received by said first counter from said clock.

7. The circuit of claim 6 wherein said control unit also includes:

a multiplexer having select inputs, a second counter, and a third counter, said multiplexer being connected between said first and second counters, said third counter being connected between said second counter and said select inputs of said multiplexer;

said second counter receiving the multiplied clock pulses from said first counter via said multiplexer and outputting said control pulses;

said third counter receiving at least one of the control pulses from said second counter and being operable to control said select inputs of said multiplexer for ensuring that the multiplied clock pulses sent each period from said first counter to said second counter via said are multiplexer are adjusted in number to compensate for any variation in frequency of input pulses received by said flip-flop such that accurate operation of said circuit can be maintained independent of input pulse frequency.

8. The circuit of claim 5 wherein said memory unit stores a look-up table of values representing an array of different counts of increments by which the resistance of said potentiometer unit can be adjusted.

9. The circuit of claim 8 wherein said memory unit is accessed by input signals which identify different addresses of said memory unit.

10. The circuit of claim 9 wherein said input signals are composed of the control pulses from said control unit and the other pulses from said external source defining different desired phase shifts of the output pulses.

11. The circuit of claim 10 wherein said potentiometer adjustment unit receives output signals produced by said memory unit and adjusts the resistance of said potentiometer unit by the counts of increments stored at the accessed addresses of said memory unit and thereby sets the desired frequency of the clock pulses generated by said clock generator and the phase shifts of the output pulses produced by said shift register.

12. The circuit of claim 11 wherein said potentiometer unit is a plurality of potentiometer modules connected in series with one another and with said clock generator, said potentiometer modules also being connected in parallel with said potentiometer adjustment unit.

13. The circuit of claim 11 wherein said potentiometer adjustment unit includes:

a counter connected to the memory unit for receiving the output signals from the memory unit and providing the correct count stored at the accessed address of said memory unit to use in adjusting the resistance of said potentiometer unit; and an array of programmable logic connected to said counter and said potentiometer unit for adjusting the resistance of said potentiometer unit by applying the correct count of increments provided by said counter to said potentiometer unit.

14. A precision digital phase lock loop circuit, comprising:

a serial shift register for receiving digital input pulses and producing time-delayed digital output pulses from the input pulses;

a clock generator for applying clock pulses to said shift register to drive it and set the time delay and thereby the phase shift of the output pulses, said generator having a resistance;

a potentiometer unit composed of a plurality of digitally-controlled potentiometer modules connected in series with one another and with said clock generator and being adjustable to change the resistance of said potentiometer unit in increments in order to adjust the resistance of said clock generator and thereby set the frequency of the clock pulses applied to said shift register and the time delay produced by said shift register; and a feedback control arrangement including a control unit, a potentiometer adjustment unit, and a programmable read-only memory unit connected in series between said control unit and said adjustment unit, said read-only memory unit storing a look-up table of values representing an array of different counts of increments by which the resistance of said potentiometer unit can be adjusted;

said control unit for receiving the same digital input pulses as received by said shift register and detecting the periods of these input pulses by counting and, in response thereto, producing control pulses proportional to the detected periods;

said read-only memory unit having accessible addresses for storing count values, said unit for receiving said control pulses from said control unit and receiving other pulses from an external source representing desired phase shifts of the output signals of said shift register and, in response thereto, producing output signals;

said potentiometer adjustment unit receiving the output signals produced by said memory unit and adjusting the resistance of said potentiometer unit by applying the count of increments stored at the accessed address of said memory unit to said potentiometer unit and thereby setting the desired frequency of the clock pulses generated by said clock generator and the phase shifts of the output pulses produced by said shift register.

15. The circuit of claim 14 wherein said plurality of potentiometer modules are connected in parallel with said potentiometer adjustment unit.

16. The circuit of claim 14 wherein said control unit includes:

a flip-flop, a clock, and a first counter, said clock being connected between said flip-flop and said first counter;

said flip-flop being operable for sensing the beginning and end of one period between consecutive input pulses and causing said clock to start and stop application of clock pulses to said first counter in correspondence to the beginning and end of the one period;

said first counter, in response to application of the clock pulses, being operable to start counting and outputting clock pulses in correspondence to the beginning and end of the one period, the number of clock pulses outputted by said first counter being a multiple of the number of clock pulses received by said first counter from said clock.

17. The circuit of claim 16 wherein said control unit also include:

a multiplexer, a second counter, and a third counter, said multiplexer being connected between said first and second counters, said third counter being connected between said second counter and select inputs of said multiplexer;

said second counter receiving the multiplied clock pulses from said first counter via said multiplexer and outputting said control pulses;

said third counter receiving at least one of the control pulses from said second counter and being operable to control said select inputs of said multiplexer for ensuring that the multiplied clock pulses sent each period from said first counter to said second counter via are multiplexer are adjusted in number to compensate for any variation in frequency of input pulses received by said flip-flop such that accurate operation of said circuit can be maintained independent of input pulse frequency.

18. The circuit of claim 14 wherein said read-only memory unit connected to said control unit is accessed by input signals which identify different addresses of said memory unit.

19. The circuit of claim 18 wherein said input signals are composed of the control pulses from said control unit and the other pulses from said external source defining different desired phase shifts of the output pulses.

20. The circuit of claim 14 wherein said potentiometer adjustment unit includes:

a counter connected to the memory unit for receiving the output signals from the memory unit and providing the correct count stored at the accessed address of said memory unit to use in adjusting the resistance of said potentiometer unit; and an array of programmable logic connected to said counter and said potentiometer unit for adjusting the resistance of said potentiometer unit by applying the correct count of increments provided by said counter to said potentiometer unit.

* * * * *